US009896556B2

(12) United States Patent
Gila et al.

(10) Patent No.: US 9,896,556 B2
(45) Date of Patent: Feb. 20, 2018

(54) PROCESS FOR THE IMPREGNATION OF POLYMER SUBSTRATES

(71) Applicant: ENI S.p.A., Rome (IT)

(72) Inventors: Liliana Gila, Casalino (IT); Giacomo Ottimofiore, Senago (IT)

(73) Assignee: ENI S.p.A., Rome (IT)

( * ) Notice: Subject to any disclaimer, the term of this patent is extended or adjusted under 35 U.S.C. 154(b) by 0 days.

(21) Appl. No.: 15/300,596

(22) PCT Filed: Apr. 14, 2015

(86) PCT No.: PCT/IB2015/052716
§ 371 (c)(1),
(2) Date: Sep. 29, 2016

(87) PCT Pub. No.: WO2015/159221
PCT Pub. Date: Oct. 22, 2015

(65) Prior Publication Data
US 2017/0183466 A1 Jun. 29, 2017

(30) Foreign Application Priority Data
Apr. 15, 2014 (IT) .............................. MI2014A0706

(51) Int. Cl.
C08J 7/02 (2006.01)
C08J 7/06 (2006.01)
H01L 31/055 (2014.01)
G02B 5/22 (2006.01)

(52) U.S. Cl.
CPC . C08J 7/02 (2013.01); C08J 7/06 (2013.01); C08J 7/065 (2013.01); G02B 5/223 (2013.01); H01L 31/055 (2013.01)

(58) Field of Classification Search
CPC ..... C08J 7/02; C08J 7/06; C08J 7/065; G02B 5/223; H01L 31/055
See application file for complete search history.

(56) References Cited

U.S. PATENT DOCUMENTS 6,033,731 A * 3/2000 Liebert .................. A01N 25/10
427/222
2013/0074930 A1* 3/2013 Lichtenstein .......... C09K 11/02
136/257

FOREIGN PATENT DOCUMENTS

| EP | 0 981 955 A2 | 3/2000 | |
| GB | 1 310 696 A | 3/1973 | |
| GB | 1310696 | * 3/1973 | .............. C08F 47/22 |

OTHER PUBLICATIONS

International Search Report and Written Opinion dated Jun. 30, 2015 in PCT/2015/IB052716 filed Apr. 14, 2015.

* cited by examiner

Primary Examiner — Bijan Ahvazi
(74) Attorney, Agent, or Firm — Oblon, McClelland, Maier & Neustadt, L.L.P.

(57) ABSTRACT

Process for the impregnation of a polymer substrate including at least one polymer, which comprises putting said polymer substrate in contact with at least one aqueous emulsion, preferably an aqueous microemulsion, including at least one organic additive. The impregnated polymer substrate obtained from said process can be advantageously used for obtaining polymer end-products having improved aesthetic characteristics (for example, impregnation with at least one dye) or stability characteristics (for example, impregnation with at least one stabilizer), which can be used in various fields such as, for example, the optical field (e.g., advanced optical components, laser applications), the medical field (e.g., the release of pharmaceutical substances), the agricultural field (e.g., release of pesticides), fragrances (e.g., release of fragrances). More specifically, said polymer substrate can be used in luminescent solar concentrators (LSCs) which, in their turn, can be advantageously used together, for example, with photovoltaic cells (or solar cells), or photoelectrolytic cells, in solar devices (i.e. devices for exploiting solar energy). Furthermore, said luminescent solar concentrators (LSCs) can be advantageously used together, for example, with photovoltaic cells (or solar cells), in photovoltaic windows.

15 Claims, No Drawings

PROCESS FOR THE IMPREGNATION OF POLYMER SUBSTRATES

The present invention relates to a process for the impregnation of polymer substrates.

More specifically, the present invention relates to a process for the impregnation of a polymer substrate including at least one polymer, which comprises putting said polymer substrate in contact with at least one aqueous emulsion, preferably an aqueous microemulsion, including at least one organic additive.

The impregnated polymer substrate obtained from said process can be advantageously used for obtaining polymer end-products having improved aesthetic characteristics (for example, impregnation with at least one dye) or stability (for example, impregnation with at least one stabilizer), which can be used in various fields such as, for example, the optical field (e.g., advanced optical components, laser applications), the medical field (e.g. the release of pharmaceutical substances), the agricultural field (e.g., release of pesticides), fragrances (e.g., release of fragrances). More specifically, said polymer substrate can be used in luminescent solar concentrators (LSCs) which, in they turn, can be advantageously used together, for example, with photovoltaic cells (or solar cells), or photoelectrolytic cells, in solar devices (i.e. devices for exploiting solar energy). Furthermore, said luminescent solar concentrators (LSCs) can be advantageously used together, for example, with photovoltaic cells (or solar cells), in photovoltaic windows.

The present invention therefore also relates to a luminescent solar concentrator (LSC) comprising at least one polymer substrate obtained by means of the above process.

The present invention also relates to a solar device (i.e. a device for exploiting solar energy) comprising at least one luminescent solar concentrator (LSC) comprising at least one polymer substrate obtained with the above process, and at least one photovoltaic cell (or solar cell), or at least one photoelectrolytic cell, as well as to a photovoltaic window comprising at least one luminescent solar concentrator (LSC) comprising at least one polymer substrate obtained with the above process, and at least one photovoltaic cell (or solar cell).

The use of polymer substrates impregnated with specific additives which confer new properties to said polymer substrates and allow new uses thereof, is known in the art. For this purpose, one of the most widely-used polymers, in particular for applications in the optical and medical fields, is polymethylmethacrylate (PMMA), as such or in a mixture with other polymers.

Said impregnated polymer substrates can be prepared according to methods known in the art such as, for example, by the addition of the additive to the monomer in the bulk polymerization phase or in solution, or by addition to the polymer in the extrusion phase.

The chemical reactions that take place during the above bulk polymerization processes or in solution, however, in addition to the high temperatures at which they are generally carried out, can negatively influence the additives added causing a degradation of the same as in the case, for example, of the use of organic dyes which are largely thermally labile.

Efforts have been made in the art for overcoming the above drawbacks.

U.S. Pat. No. 4,139,342, for example, describes a method for impregnating a plastic material with a dye for laser applications comprising the steps of: forming a solvent/dye solution by mixing from about $5 \times 10^{-5}$ moles to about $3 \times 10^{-3}$ moles of dye in 1 liter of organic solvent (for example, methanol, ethanol); optionally adjusting the pH of said solution to a preselected value on the basis of the dye used; immersing said plastic material in said solution at atmospheric pressure; increasing the temperature of said solution maintaining the concentration of said dye in said solvent, constant; allowing said plastic material to remain immersed in said solution for about 1-2 weeks while said plastic material becomes impregnated with said dye; removing said impregnated plastic material from said solution; and subsequently removing the excess of said dye/solvent solution from said impregnated plastic material by putting said material in an oven at a temperature lower than 95° C., for a time ranging from 1 to 2 weeks, and subsequently cooling said material to room temperature.

In "*Journal of Coatings Technology*" (1983), Vol. 55, No. 701, pages 53-57, Guerra G. et al. describe the colouring of the surface of glass polymers by diffusion of the dye with a solvent, in particular methanol. Good results were obtained in colouring of samples of polymethylmethacrylate (PMMA) obtained by both casting and by extrusion, with diffusion of the dye with methanol.

In "*Journal of Applied Polymer Science*" (1984), Vol. 29, pages 2271-2279, Guerra G. et al. describe the concentration profile of additives, in particular zinc chloride, in glass polymers, in particular polymethylmethacrylate (PMMA), by diffusion with a solvent, in particular methanol. Said profile depends not only on the diffusion conditions (temperature, time, type of solvent, concentration), but also on the desorption conditions of the solvent from the polymer (temperature, pressure, type of solvent, volatility of the additive).

The high quantities of solvent used in the above processes, however, can cause problems for both the health of the operators and also from an environmental point of view, in addition to higher process costs due to their disposal. Furthermore, said processes are generally carried out at temperature higher than room temperature (25° C.) (for example, at 60° C. in the case of methanol).

Further efforts have therefore been made in the art for overcoming the above-mentioned drawbacks.

U.S. Pat. No. 4,598,006, for example, describes a method for forming an impregnated thermoplastic polymer, which comprises: dissolving an impregnation material in a volatile swelling agent, preferably carbon dioxide ($CO_2$), kept under or close to supercritical conditions for said swelling agent, said impregnation material being selected from the group consisting of fragrances, pesticides, pharmaceutical substances; swelling the thermoplastic polymer with the impregnation material filled with the volatile swelling agent operating under or close to supercritical conditions for said swelling agent; and reducing the pressure so as to diffuse the volatile swelling agent outside the impregnated thermoplastic polymer.

In "*Journal of Applied Polymer Science*" (1992), Vol. 46, pages 231-242, Berens A. R. et al. describe the use of carbon dioxide ($CO_2$) for accelerating the absorption of low-molecular-weight additives (e.g., dimethyl phthalate) in glass polymers [e.g., polymethylmethacrylate (PMMA), polyvinyl chloride (PVC), polystyrene (PS), polycarbonate (PC)].

In "*Applied Spectroscopy*" (1997), Vol. 51, No. 4, pages 491-494, Kazarian S. G. et al. describe the FT-IR spectroscopic analysis in situ of both polymethylmethacrylate (PMMA) films in the presence of carbon dioxide ($CO_2$) under supercritical conditions (plasticization), and also polymethylmethacrylate (PMMA) films impregnated with an organic dye (Disperse Red 1) in the presence of carbon dioxide ($CO_2$) under supercritical conditions (impregnation).

In "*Journal of Applied Polymer Science*" (2003), Vol. 90, pages 3652-3659, Domingo C. et al. describe the behavior of systems based on polymethylmethacrylate in the presence of carbon dioxide under supercritical conditions ("supercritical carbon dioxide"—$SCCO_2$). In particular, they show that the presence of carbon dioxide under supercritical conditions ("supercritical carbon dioxide"—$SCCO_2$) allows the polymer to swell, thus facilitating the removal of toxic substances and the impregnation with additives.

In "*SEN'I GAKKAISHI*" (2011), Vol. 67, No. 2, pages 34-39, Zhao C. et al. describe the use of carbon dioxide ($CO_2$) under supercritical conditions, for impregnating optical fibers based on polymethylmethacrylate (PMMA) with a fluorescent dye (Rhodamine 6G).

The above-mentioned processes that use carbon dioxide ($CO_2$) under supercritical conditions, are advantageous when a relatively low process temperature is required due to the thermolability of the additives. Said processes, moreover, do not require the use of organic solvents, except in minimum quantities, when the additives are not completely soluble in the fluid kept under supercritical conditions.

Furthermore, carbon dioxide ($CO_2$) is non-toxic, non-flammable, economical and non-polluting. The supercritical conditions under which the carbon dioxide ($CO_2$) is used envisage temperatures ranging from 20° C. to 80° C. and pressures higher than 50 bar. Furthermore, the solubility of carbon dioxide ($CO_2$) in the polymers, under said supercritical conditions, is high and is similar to that of typical organic solvents used in solvent dye diffusion processes, said solubility generally ranging from 10% by weight to 30% by weight, with respect to the total weight of the polymer.

The above processes using carbon dioxide ($CO_2$) under supercritical conditions, however, can also have some drawbacks, in particular relating to an increase in the process costs. Said processes, in fact, as already indicated above, are carried out at high pressures and consequently require suitable equipment capable of operating at said high pressures.

The Applicant has therefore considered the problem of finding a process for impregnating a polymer substrate with at least one organic additive, capable of overcoming the above-mentioned drawbacks.

The Applicant has found that the use of an aqueous emulsion, preferably an aqueous microemulsion, including at least one organic additive, allows an impregnation process of a polymer substrate to be obtained, which is capable of overcoming the above-mentioned drawbacks. The use of said aqueous emulsion or microemulsion allows to limit the use of toxic and/or flammable solvents. The use of said aqueous emulsion or microemulsion also allows high concentrations of local additive(s) to be reached (i.e. high concentrations of additive(s) within the micelles of the emulsion or microemulsion) without having to use high quantities of additive(s) and, in the case of more than one additive, favours their interaction. Furthermore, the use of said aqueous emulsion or microemulsion makes it possible to operate at low temperatures and at low pressures, therefore also in the presence of thermally labile additives, at relatively short times (in the order of minutes-hours) and does not require the use of particular equipment.

An object of the present invention therefore relates to a process for the impregnation of a polymer substrate including at least one polymer, which comprises putting said polymer substrate in contact with at least one aqueous emulsion, preferably an aqueous microemulsion, including at least one organic additive.

For the purpose of the present description and of the following claims, the definitions of the numerical ranges always comprise the extremes, unless otherwise specified.

For the purpose of the present description and of the following claims, the term "comprising" also includes the terms "which essentially consists of" or "which consists of".

For the purpose of the present description and of the following claims, the term "microemulsion" refers to an emulsion in which the dispersed phase is distributed in the dispersing phase in the form of micelles having a diameter ranging from 1 nm to 100 nm, preferably ranging from 2 nm to 10 nm.

For the purpose of the present invention, any thermoplastic or elastomeric polymer capable of swelling can be used.

Specific and non-limiting examples of thermoplastic and elastomeric polymers that can be advantageously used for the purpose of the present invention are: polyolefins, polyamides, polyimides, polyesters, polyurethanes, polyacrylates, polycarbonates, polyacetylenes, polyisoprene, polystyrenes, styrene-butadiene copolymers, styrene-acrylonitrile copolymers, ethylene-vinyl acetate copolymers, chloroprene polymers, polyethers-amides, vinyl chloride polymers, vinylidene chloride polymers, epoxy polymers, natural rubber, butyl rubbers, nitrile rubbers, silicon, polyvinyl alcohol polymers, polymers deriving from cellulose, polymers deriving from proteins (e.g., albumin), polymers of lactic acid, polymers of glycolic acid, or mixtures thereof.

According to a preferred embodiment of the present invention, said polymer can be selected from polyacrylates, polycarbonates, polystyrenes, styrene-acrylonitrile copolymers, or mixtures thereof. Preferably, said polymer can be selected from polymethylmethacrylate (PMMA), styrene-acrylonitrile copolymer (SAN), or mixtures thereof.

It should be pointed out that, for the purpose of the present invention, said organic additive is selected from compounds that are soluble and stable in the organic solvents immiscible with water indicated hereunder.

Specific and non-limiting examples of organic additives that can be advantageously used for the purpose of the present invention are: dyes (for example, natural pigments, or synthetic pigments based on azo-derivatives, anthraquinones, or triarylmethane); photoluminescent dyes (for example, xanthenes, oxazines, carbazines, cumarins, benzothiadiazole compounds, acene compounds, perylene compounds); stabilizers (for example, light stabilizers, UV stabilizers, oxidation stabilizers, flame retardants, plasticizers).

According to a preferred embodiment of the present invention, said organic additives can be selected from photoluminescent dyes.

The photoluminescent dyes that can be used for the purpose of the present invention can be selected from photoluminescent dyes that absorb within the UV-visible range and emit within both the UV-visible and infrared range, and which are soluble and stable in the organic solvents immiscible with water indicated hereunder. Photoluminescent dyes that can be advantageously used for the purpose of the present invention are, for example, compounds known with the trade-name Lumogen® of Basf, acene compounds described in international patent application WO 2011/048458 in the name of the Applicant, benzothiadiazole compounds.

According to a preferred embodiment of the present invention, said photoluminescent dyes can be selected, for example, from benzothiadiazole compounds, acene compounds, perylene compounds, or mixtures thereof. Preferably, said photoluminescent dyes can be selected from 4,7-di-2-thienyl-2,1,3-benzothiadiazole (DTB), 4,7-bis(7',8'-dibutylbenzo[1',2'-b': 4',3'-b]-dithien-5'-yl)benzo-[c][1,2,5]thiadiazole (F500), 9,10-diphenylanthracene (DPA), N,N'-bis(2',6'-di-iso-propylphenyl) (1,6,7,12-tetraphenoxy) (3,4,9,10-perylene-diimide (Lumogen® F Red 305—Basf), or mixtures thereof. 4,7-di-2-thienyl-2,1,3-benzothiadiazole (DTB) is particularly preferred.

According to a preferred embodiment of the present invention, said aqueous emulsion or said aqueous microemulsion can comprise:
- from 20% by weight to 90% by weight, preferably from 50% by weight to 70% by weight, of water, with respect to the total weight of surfactant+co-surfactant+water;
- from 3% by weight to 25% by weight, preferably from 10% by weight to 15% by weight, of at least one surfactant, with respect to the total weight of surfactant+co-surfactant+water;
- from 0% by weight to 50% by weight, preferably from 10% by weight to 30% by weight, of a least one co-surfactant, with respect to the total weight of surfactant+co-surfactant+water;
- from 1% by weight to 90% by weight, preferably from 5% by weight to 20% by weight, of a least one organic solvent immiscible with water, with respect to the total weight of organic solvent immiscible with water+water;
- from 0.02% by weight to 2% by weight, preferably from 0.1% by weight to 0.5% by weight, of a least one organic additive, with respect to the total weight of organic additive+organic solvent immiscible with water.

According to a preferred embodiment of the present invention, said surfactant can be selected from anionic surfactants such as, for example, sodium dodecyl sulfate (SDS), sodium octadecyl sulfate, nonylphenol heterosulfate, or mixtures thereof. Sodium dodecyl sulfate (SDS) is preferred.

According to a preferred embodiment of the present invention, said co-surfactant can be selected, for example, from alcohols such as 1-butanol, 1-pentanol, 1-hexanol, 1-octanol, or mixtures thereof. 1-Butanol is preferred.

According to a preferred embodiment of the present invention, said organic solvent immiscible with water can be selected from organic solvents immiscible with water such as, for example, toluene, cyclohexane, heptane, or mixtures thereof. Toluene is preferred.

The above emulsions and microemulsions can be prepared according to methods known in the art, as described, for example, by: Lang J. et al., in "*Journal of Physical Chemistry*" (1980), Vol. 84 (12), pages 1541-1547; Ramos G. R. et al., in "*Analytica Chimica Acta*" (1988), Vol. 208, pages 1-19; Shao G. Q. et al., in "*Chinese Chemical Letters*" (2001), Vol 12 (12), pages 1109-112; Oliveira M. E. C. D. R. et al., in "*Journal of Molecular Structure*" (2001), Vol. 563-564, pages 443-447.

According to a preferred embodiment of the present invention, said process can be carried out at a temperature ranging from 15° C. to 40° C., preferably at room temperature (25° C.).

According to a preferred embodiment of the present invention, said process can be carried out for a time ranging from 5 minutes to 3 hours, preferably from 20 minutes to 30 minutes.

According to a preferred embodiment of the present invention, said process can be carried out at a pressure ranging from 1 atm to 5 atm, preferably at atmospheric pressure (1 atm).

For the purpose of the present invention, said polymer substrate can be used in any form such as, for example, flakes, pellets, sheets or articles having other forms obtained by casting, by extrusion or by moulding.

For the purpose of the present invention, said process can be carried out according to techniques known in the art, depending on the type and the form of polymer substrate to be impregnated. Said polymer substrate, for example, can be completely immersed in said aqueous emulsion or in said aqueous microemulsion in order to be completely impregnated, or it can be partly immersed in said aqueous emulsion or in said aqueous microemulsion in order to be partly impregnated. Glass, metal or Teflon containers can be used for the purpose.

As indicated above, the impregnated polymer substrate obtained from said process can be advantageously used for obtaining polymer end-products having improved aesthetic characteristics (for example, impregnation with at least one dye) or stability characteristics (for example, impregnation with at least one stabilizer), which can be used in various fields such as, for example, the optical field (e.g., advanced optical components, laser applications), the medical field (e.g., the release of pharmaceutical substances), the agricultural field (e.g., release of pesticides), fragrances (e.g., release of fragrances). More specifically, said polymer substrate can be used in luminescent solar concentrators (LSCs) which, in their turn, can be advantageously used together, for example, with photovoltaic cells (or solar cells), or photoelectrolytic cells, in solar devices (i.e. devices for exploiting solar energy). Furthermore, said luminescent solar concentrators (LSCs) can be advantageously used together, for example, with photovoltaic cells (or solar cells), in photovoltaic windows.

A further object of the present invention therefore relates to a luminescent solar concentrator (LSC) comprising at least one polymer substrate obtained by means of the above process.

Furthermore, a further object of the present invention relates to a solar device (i.e. a device for exploiting solar energy) comprising at least one luminescent solar concentrator (LSC) comprising at least one polymer substrate obtained with the above process, and at least one photovoltaic cell (or solar cell), or at least one photoelectrolytic cell.

A further object of the present invention also relates to a photovoltaic window comprising at least one luminescent solar concentrator (LSC) comprising at least one polymer substrate obtained with the above process, and at least one photovoltaic cell (or solar cell).

Some illustrative and non-limiting examples are provided hereunder for a better understanding of the present invention and for its practical embodiment.

In the following examples, the following photoluminescent dyes were used:

4,7-di-2-thienyl-2,1,3-benzothiadiazole (DTB) which was synthesized as described in Example 1 of international patent application WO 2012/007834 in the name of the Applicant;

4,7-bis(7',8'-dibutylbenzo[1',2'-b':4',3'-b"]dithien-5'-yl)-benzo[c][1,2,5]-thiadiazole (F500), which was synthesized as described in Example 1 of Italian patent application MI2013A000605, in the name of the Applicant; N,N'-bis(2',6'-di-iso-propylphenyl)(1,6,7,12-tetraphenoxy) (3,4,9,10-perylene-diimide (Lumogen® F Red 305 of Basf).

EXAMPLE 1

Preparation of Microemulsions Including 4,7-Di-2-Thienyl-2,1,3-Benzothiadiazole (DTB)

Microemulsion EM77

16 g of sodium dodecyl sulfate (SDS) (Acros Organics 99%) and 93 ml of pure water MilliQ (MQ—Millipore) were introduced into a 250 ml flask: the whole mixture was kept under stirring until a limpid solution was obtained. 41.3 ml of 1-butanol (Acros Organics 99%), 83.4 mg of 4,7-di-2-thienyl-2,1,3-benzothiadiazole (DTB) and 7.5 ml of toluene (Aldrich) were subsequently added in sequence: the whole mixture was left, at room temperature (25° C.), under stirring, for about 1 hour and then left to rest for a night, obtaining a transparent orange-coloured microemulsion and a final concentration of 4,7-di-2-thienyl-2,1,3-benzothiadiazole (DTB) in the microemulsion equal to $2 \times 10^{-3}$ M.

Microemulsion EM78

161 g of sodium dodecyl sulfate (SDS) (Acros Organics 99%) and 912 ml of pure water MilliQ (MQ—Millipore) were introduced into a 2.5 liter flask: the whole mixture was kept under stirring until a limpid solution was obtained. 401 ml of 1-butanol (Acros Organics 99%), 958 mg of 4,7-di-2-thienyl-2,1,3-benzothiadiazole (DTB) and 292 ml of toluene (Aldrich) were subsequently added in sequence: the whole mixture was left, at room temperature (25° C.), under stirring, for about 1 hour and then left to rest for a night, obtaining a transparent orange-coloured microemulsion and a final concentration of 4,7-di-2-thienyl-2,1,3-benzothiadiazole (DTB) in the microemulsion equal to $2 \times 10^{-3}$ M.

Microemulsion EM73

13 ml of a solution 0.6 M of sodium dodecyl sulfate (SDS) (Acros Organics 98%) in pure water MilliQ (MQ—Millipore) were poured into a 50 ml flask. 5.7 ml of pure water MilliQ (MQ—Millipore) and 0.5 ml of a solution 0.05 M of 4,7-di-2-thienyl-2,1,3-benzothiadiazole (DTB) in toluene (Aldrich), were subsequently added in sequence: the whole mixture immediately became limpid and was left, at room temperature (25° C.), under stirring, for 30 minutes, and then left to rest for a night, obtaining a transparent yellow-coloured microemulsion and a final concentration of 4,7-di-2-thienyl-2,1,3-benzothiadiazole (DTB) in the microemulsion equal to $1 \times 10^{-3}$ M.

Microemulsion EM74

13 ml of a solution 0.6 M of sodium dodecyl sulfate (SDS) (Acros Organics 98%) in pure water MilliQ (MQ—Millipore) were poured into a 50 ml flask. 5.7 ml of 1-butanol (Acros Organics 99%) and 0.5 ml of a solution 0.05 M of 4,7-di-2-thienyl-2,1,3-benzothiadiazole (DTB) in toluene (Aldrich), were subsequently added in sequence: the whole mixture immediately became limpid and was left, at room temperature (25° C.), under stirring, for 30 minutes, and then left to rest for a night, obtaining a transparent yellow-coloured microemulsion and a final concentration of 4,7-di-2-thienyl-2,1,3-benzothiadiazole (DTB) in the microemulsion equal to $1 \times 10^{-3}$ M.

EXAMPLE 2

Preparation of Microemulsions Including Various Fluorescent Dyes

Microemulsion EM66

13 ml of a solution 0.6 M of sodium dodecyl sulfate (SDS) (Acros Organics 98%) in pure water MilliQ (MQ—Millipore) were poured into a 50 ml flask. 5.7 ml of 1-butanol (Acros Organics 99%) and 4.2 ml of a solution $2 \times 10^{-3}$ M of 4,7-di-2-thienyl-2,1,3-benzothiadiazole (DTB) in toluene (Aldrich), were subsequently added in sequence: the whole mixture immediately became limpid and was left, at room temperature (25° C.), under stirring, for 30 minutes, and then left to rest for a night, obtaining a transparent light yellow-coloured microemulsion and a final concentration of 4,7-di-2-thienyl-2,1,3-benzothiadiazole (DTB) in the microemulsion equal to $3 \times 10^{-4}$ M.

Microemulsion EM76

13 ml of a solution 0.6 M of sodium dodecyl sulfate (SDS) (Acros Organics 98%) in pure water MilliQ (MQ—Millipore) were poured into a 50 ml flask. 5.7 ml of 1-butanol (Acros Organics 99%) and 4.2 ml of a solution $2.8 \times 10^{-3}$ M of Lumogen® F Red 305 in toluene (Aldrich), were subsequently added in sequence: the whole mixture immediately became limpid and was left, at room temperature (25° C.), under stirring, for 30 minutes, and then left to rest for a night, obtaining a transparent dark red-coloured microemulsion and a final concentration of Lumogen® F Red 305 in the microemulsion equal to $5 \times 10^{-4}$ M.

Microemulsion EM80

13 ml of a solution 0.6 M of sodium dodecyl sulfate (SDS) (Acros Organics 98%) in pure water MilliQ (MQ—Millipore) were poured into a 50 ml flask. 5.7 ml of 1-butanol (Acros Organics 99%) and 4.2 ml of a solution $2 \times 10^{-3}$ M of 4,7-bis(7',8'-dibutylbenzo[1',2'-b': 4',3'-b"]dithien-5'-yl)benzo[c][1,2,5]thia-diazole (F500) in toluene (Aldrich) were subsequently added in sequence: the whole mixture immediately became limpid and was left, at room temperature (25° C.), under stirring, for 30 minutes, and then left to rest for a night, obtaining a transparent red-orange-coloured microemulsion and a final concentration of 4,7-bis(7',8'-dibutylbenzo[1',2'-b':4',3'-b" ]dithien-5'-yl)benzo[c][1,2,5]-thiadiazole (F500) in the microemulsion equal to $4 \times 10^{-4}$ M.

EXAMPLE 3 (COMPARATIVE)

Preparation of a Solution Including 4,7-Di-2-Thienyl-2,1,3-Benzothiadiazole (DTB)

Solution DTB52

77.8 ml of toluene (Aldrich) and 40.4 mg of 4,7-di-2-thienyl-2,1,3-benzothiadiazole (DTB) were introduced into a 100 ml flask: the whole mixture was kept under stirring, immediately obtaining a limpid yellow-coloured solution and a final concentration of 4,7-di-2-thienyl-2,1,3-benzothiadiazole (DTB) in the solution equal to $2 \times 10^{-3}$ M.

EXAMPLE 4

Impregnation of Polymer Sheets

A polymer sheet of polymethylmethacrylate (PMMA) Altuglas (dimensions 2.5×2.5×5 mm), obtained by casting, was completely immersed, in a vertical position, in an 80 ml beaker containing the microemulsion EM77 obtained as described in Example 1, and maintained therein at room temperature (25° C.) and at atmospheric pressure. The sheet was then removed from the beaker, washed with abundant distilled water, dried with a cloth and left to dry in the air, at room temperature (25° C.), for a night.

Other polymer sheets of polymethylmethacrylate (PMMA) Altuglas (dimensions 2.5×2.5×5 mm) were impregnated, operating as described above, using:
- the microemulsions EM78, EM73 and EM74, obtained as described in Example 1;
- the microemulsions EM66, EM76 and EM80, obtained as described in Example 2;
- the solution DTB52 obtained as described in Example 3.

The sheets thus obtained were subjected to determination of the quantity of dye present on the same.

For this purpose, they were subjected to UV-Vis absorption spectroscopy, measuring the absorbance characteristic of each photoluminescent dye, after calibration using reference sheets containing known quantities of photoluminescent dye dispersed in the same polymer matrix.

The UV-Vis spectra were acquired by means of a Perkin Elmer Lambda 950 double-ray and double monochromator spectrophotometer: the results obtained are reported in Table 1 and in Table 2. In Table 1 and Table 2, the immersion times of the sheet are also reported.

TABLE 1

| SAMPLE | PHOTO-LUMINESCENT DYE (% by wt)* | TOLUENE (% by wt) | PHOTO-LUMINESCENT DYE (ppm)** | TIME (hours) |
|---|---|---|---|---|
| EM77 | 0.06 | 4 | 33 | 0.5 |
| EM78 | 0.06 | 15 | 117 | 0.5 |
| DTB52 | 0.06 | 100 | 12 | 0.5 |
| DTB52 | 0.06 | 100 | 22 | 1 |
| EM73 | 0.04 | 2 | 39 | 2.5 |
| EM74 | 0.04 | 2 | 77 | 2.5 |

*wt % percentage of photoluminescent dye in the microemulsion or in the solution;
**ppm of photoluminescent dye in the impregnated sheet obtained from the UV-visible absorption curves of the photoluminescent dyes.

From the data reported in Table 1, it can be seen that the sheets obtained by impregnation with the microemulsions EM77 and EM78 according to the present invention, give better results (i.e. a greater quantity of photoluminescent dye present on the sheet) with respect to the sheets obtained by impregnation with the solution in toluene (DTB52).

Furthermore, it can be noted that the presence of the co-surfactant (i.e. butanol) in the impregnating microemulsion (EM74) allows a greater quantity of photoluminescent dye to be obtained on the sheet with respect to the microemulsion without co-surfactant (EM73).

From the data reported in Table 2, it can be seen that the sheet obtained by impregnation with the microemulsion EM66 gives better results (i.e. a greater quantity of photoluminescent dye present on the sheet) with respect to the sheets obtained by impregnation with the microemulsions EM76 and EM80.

EXAMPLE 5

Impregnation of Polymer Sheets on Two Sides in a Vertical Position (EM78f and EM78d)

A polymer sheet of polymethylmethacrylate (PMMA) Altuglas (dimensions 9×20×5 mm), obtained by casting, was arranged in a vertical position in a basin (dimensions 23×23×7 mm) to which the microemulsion EM78 obtained as described in Example 1 was added, in such a quantity so as to completely cover it and it was maintained therein at room temperature (25° C.) and at atmospheric pressure (1 bar). The sheet was then removed from the basin, washed with abundant distilled water, dried with a cloth and left to dry in the air, at room temperature (25° C.), for a night (EM78f).

Another polymer sheet of polystyrene-acrylonitrile (SAN) (Kostil® B 266 of versalis spa) (dimensions 9×20×5 mm), obtained by extrusion, was impregnated, operating as described above (EM78d).

EXAMPLE 6

Impregnation of Polymer Sheets on One Side in a Horizontal Position (EM78m) and on Two Sides in a Horizontal Position (EM78n)

A polymer sheet of polymethylmethacrylate (PMMA) Altuglas (dimensions 9×20×5 mm), obtained by casting, was arranged in a horizontal position in a basin (dimensions 24×19×7 mm) to which the microemulsion EM78 obtained as described in Example 1 was added, in such a quantity so as to completely wet the lower part of the sheet, and it was maintained therein at room temperature (25° C.) and at atmospheric pressure (1 bar). The sheet was then removed from the basin, washed with abundant distilled water, dried with a cloth and left to dry in the air, at room temperature (25° C.), for a night (EM78m).

Another polymer sheet of polymethylmethacrylate (PMMA), on the other hand, was arranged in a horizontal position in a basin (dimensions 24×19×7 mm) to which the microemulsion EM78 obtained as described in Example 1 was added, in such a quantity so as to completely wet the whole of the sheet, and it was maintained therein at room temperature (25° C.) and at atmospheric pressure (1 bar). The sheet was then removed from the basin, washed with abundant distilled water, dried with a cloth and left to dry in the air, at room temperature (25° C.), for a night (EM78n).

TABLE 2

| SAMPLE | PHOTOLUMINESCENT DYE (type) | PHOTOLUMINESCENT DYE (type) | | TOLUENE | PHOTOLUMIINESCENT DYE (type) | | TIME |
|---|---|---|---|---|---|---|---|
| | | (wt %)$^a$ | (% mmol)$^a$ | (wt %) | ppm/sheet$^b$ | mmol/sheet$^c$ | (hrs) |
| EM66 | DTB | 0.009 | 0.03 | 15 | 43 | 0.14 | 2 |
| EM76 | Lumogen ® F Red 305 | 0.05 | 0.05 | 15 | 99 | 0.09 | 2 |
| EM80 | F500 | 0.03 | 0.04 | 15 | 45 | 0.06 | 2 |

$^a$wt % and % in mmoles of photoluminescent dye in the microemulsion;
$^b$ppm of photoluminescent dye in the impregnated sheet obtained from the UV-visible absorption curves of the photoluminescent dyes;
$^c$mmoles of photoluminescent dye in the impregnated sheet obtained from the ppm values.

EXAMPLE 7

Power Measurements ($P_{max}$)

The power measurements were carried out on impregnated polymer sheets obtained as described in Example 5 and Example 6.

For this purpose, a photovoltaic cell IXYS-XOD17 having a surface of 1.2 cm² connected to a digital multimeter, was applied on one of the two shortest edges (i.e. on one of the 9 mm edges) of the sheet to be evaluated.

The surface of the sheet was then illuminated with a light source, using an ABET solar simulator mod. SUN 2000 equipped with a 550 Watt OF Xenon lamp having a power equal to 1 sun (1,000 W/m²), for 10 seconds. A first measurement was carried out, illuminating a portion of the sheet (9×9 cm) and the electric power generated by the illumination was measured.

Power measurements were subsequently carried out on portions of sheet having the same dimensions, at increasing distances from the edge on which the photovoltaic cell was fixed (a total of 11 measurements).

The curve for the current intensity (measured in amperes)–voltage produced (measured in volts) was registered for each portion of sheet illuminated, and the average effective power ($P_{max}$) of the photovoltaic cell was calculated from this. The average effective power ($P_{max}$) was calculated ignoring the first and the last measurement (relating to the portions of sheet containing the edge with the photovoltaic cell and the opposite edge, respectively). The values obtained are reported in Table 3. Table 3 also indicates the immersion times of the sheet.

TABLE 3

| PMMA | | | | SAN | | | |
| --- | --- | --- | --- | --- | --- | --- | --- |
| SAMPLE | DTB (ppm)* | TIME (minutes) | $P_{max}$ (mw) | SAMPLE | DTB (ppm) | TIME (minutes) | $P_{max}$ (mW) |
| EM78f | 157 | 40 | 3.33 | EM78d | 46 | 5 | 2.94 |
| EM78m | 84 | 40 | 3.06 | | | | |
| EM78n | 118 | 40 | 3.32 | | | | |

*ppm of photoluminescent dye (DTB) in the impregnated sheet.

From the data reported in Table 3, it can be seen that the impregnation with the microemulsion is equally efficient on both sheets of polymethylmethacrylate (PMMA) and sheets of styrene-acrylonitrile (SAN). The difference in power developed under illumination of the polymethylmethacrylate (PMMA) sheets with respect to that developed by the styrene-acrylonitrile (SAN) sheets, is minimum, considering that the quantity of photoluminescent dye (i.e. DTB) on the styrene-acrylonitrile (SAN) sheets is much lower (EM78f versus EM78d).

It can also be seen that the position in which the sheet to be impregnated is arranged in the basin (vertical or horizontal) has no influence (EM78f versus EM78n), whereas there is a slight difference (almost negligible) between the power developed by the sheet impregnated on one side only, which, however, also contains less photoluminescent dye (i.e. DTB) and that impregnated on both sides (EM78m versus EM78n).

The invention claimed is:

1. A process for impregnating a polymer substrate, the process comprising:

contacting the polymer substrate comprising a polymer with at least one aqueous emulsion, wherein the aqueous emulsion comprises: comprising an organic additive from 50% by weight to 70% by weight of water, with respect to a total weight of at least one surfactant, at least one co-surfactant, and water:

from 10% by weight to 15% by weight of the at least one surfactant, with respect to the total weight of the at least one surfactant, the at least one co-surfactant, and water:

from 10% by weight to 30% by weight, of the least one co-surfactant, with respect to the total weight of the at least one surfactant, the at least one co-surfactant, and water:

from 5% by weight to 20% by weight of at least one organic solvent immiscible with water, with respect to a total weight of the at least one organic solvent and water: and from 0.1% by weight to 0.5% by weight, of at least one organic additive, with respect to a total weight of the at least one organic additive and the organic solvent water.

2. The process according to claim 1, wherein the polymer is at least one selected from the group consisting of a polyacrylate, a polycarbonate, a polystyrene, and a styrene-acrylonitrile copolymer.

3. The process according to claim 1, wherein the at least one organic additive is a photoluminescent dye.

4. The process according to claim 3, wherein the photoluminescent dye is at least one selected from the group consisting of a benzothiadiazole compound, an acene compound, and a perylene compound.

5. The process according to claim 1, wherein the at least one surfactant is an anionic surfactant.

6. The process according to claim 1, wherein the at least one co-surfactant is present in the aqueous emulsion and is an alcohol.

7. The process according to claim 1, wherein the at least one organic solvent is selected from the group consisting of toluene, cyclohexane, and heptane.

8. The process according to claim 1, which is carried out at a temperature of from 15° C. to 40° C.

9. The process of claim 8, wherein the process is carried out at temperature 25° C.

10. The process according to claim 1, which is carried out for a time from 5 minutes to 3 hours.

11. The process according to claim 1, which is carried out at a pressure of from 1 atm to 5 atm.

12. A luminescent solar concentrator, comprising:
at least one polymer substrate obtained by the process according to claim 1.

13. A solar device, comprising:
at least one of the luminescent solar concentrator according to claim 12, and
at least one photovoltaic cell or at least one photoelectrolytic cell.

14. A photovoltaic window, comprising:
at least one luminescent solar concentrator of claim 12, and
at least one photovoltaic cell.

15. The process of claim 1, wherein the polymer is selected from the group consisting of polymethylmethacrylate (PMMA), styrene-acrylonitrile copolymer (SAN), and a mixture thereof.

* * * * *